United States Patent [19]

Wagner et al.

[11] Patent Number: 5,051,054
[45] Date of Patent: Sep. 24, 1991

[54] ELEVATING TABLE AND TRANSPORTING METHOD

[75] Inventors: Rudolf Wagner, Fontnas; Hans Hirscher, Ragaz, both of Switzerland

[73] Assignee: Balzers Aktiengesellschaft, Balzers, Liechtenstein

[21] Appl. No.: 519,845

[22] Filed: May 7, 1990

[30] Foreign Application Priority Data

May 8, 1989 [DE] Fed. Rep. of Germany ....... 3915039

[51] Int. Cl.$^5$ .................... B65G 49/05; H01L 21/68
[52] U.S. Cl. ........................ 414/618; 204/298.23; 204/298.25; 204/298.26; 204/298.27; 414/217
[58] Field of Search .............. 414/217, 618; 198/379, 198/394; 269/305, 91; 204/298.15, 298.23, 298.25, 298.26, 298.27, 298.35; 118/719, 725, 728, 729, 500

[56] References Cited

U.S. PATENT DOCUMENTS

| | | | |
|---|---|---|---|
| 4,548,699 | 10/1985 | Hutchinson et al. | 414/217 X |
| 4,705,951 | 11/1987 | Layman et al. | 414/217 X |
| 4,895,107 | 1/1990 | Yano et al. | 118/729 X |
| 4,944,645 | 7/1990 | Suzuki | 414/217 |
| 4,944,860 | 7/1990 | Bramhall, Jr. et al. | 204/298.15 X |

FOREIGN PATENT DOCUMENTS 0250064 12/1987 European Pat. Off.
0316296 5/1989 European Pat. Off.

Primary Examiner—David A. Bucci
Attorney, Agent, or Firm—Notaro & Michalos

[57] ABSTRACT

An elevating table has a housing with a workpiece support movably guided in an upward and downward direction by which a disk-shaped workpiece is transportable into a processing chamber of a vacuum installation. To correct the position of the workpiece placed by a machine into the workpiece support, as well as for securing the workpiece during transport, holding elements are disposed on opposite sides of the elevating table. These comprise in each instance a rod at the end of a jib which is disposed on a shaft rotatably supported in the elevating table and which is rotatable by a motor within a pivotal range in order to bring the holding element into one of two different positions. With two holding elements disposed next to each other on one side of the elevating table and one holding element disposed on the opposite side of the elevating table, the position of the workpiece on the workpiece support can be corrected. A disk disposed at the each of each rod of the holding element extends over the edge of the workpiece and secures it during upward transport. The holding element is then pivoted outwardly by the motor and comes to lie with the disk underneath a covering to be protected against the effects the surface treatment of the workpiece in the processing chamber.

26 Claims, 2 Drawing Sheets

ELEVATING TABLE AND TRANSPORTING METHOD

FIELD AND BACKGROUND OF THE INVENTION

The present invention relates to an elevating table for the transport of a disk-shaped workpiece to be moved up and down within an installation for the surface treatment of the workpiece, in particular within a vacuum installation with holding elements functioning for securing the workpiece on the elevating table as well as a method for transporting and securing a disk-shaped workpiece in a surface treatment chamber by means of an elevating table for the workpiece.

An elevating table of this type has the task of guiding a workpiece to be treated on its surface, to the treatment area in a working position. In vacuum installations this takes place within a separated chamber of the installation. During transport the workpiece must be secured on the elevating table so that it maintains a given position. In many cases a very particular position of the workpiece on the elevating table is required for the surface treatment process subsequently taking place. If these workpieces are for example semiconductor disks for the manufacture of integrated microelectronic chips, each disk as a rule has a contour deviating from the circular form wherein a circle segment is cut away which functions for the identification of the crystal orientation.

The disk support of the elevating table then has the same contour deviating from the circular form and the disk must with respect to this support be held and transported in this precisely oriented position.

It is known to use elastic gripper elements or holding elements for holding the workpiece tightly, which encompass the workpiece edge and which can be brought into different positions in order to hold the workpiece in one position.

It is known from EP-A-0 250 064 to provide elastic holding pistons on an elevating table, for the transport of a disk-shaped workpiece to be moved up and down within a vacuum installation for the surface treatment of the workpiece. The elastic holding pistons are provided at an incline to the workpiece surface or elevating table support surface which, at their projecting end, are provided with a protruding gripping head. These holding pistons are moved axially and clamp the workpiece tightly in a retracted position, onto the elevating table support.

For the surface etching of silicon wafers with different acids for example, it is further known from EP-A-0 316 296 to provide lifting cogs that are driven radially on the elevating table support and which encompass and tighten the workpiece to be treated.

Holding means of this type have the disadvantage that they are exposed to the surface treatment in essentially the same way as the workpiece. If it involves a coating then on these holding means or holding elements an increasingly thicker layer gradually forms. Thereby the ability of these means to function becomes questionable and due to their mechanical drive connection, replacement is very costly.

The like applies if the surface treatment is, for example, an etching process whereby the cited holding elements are gradually eroded which, in particular in vacuum processes, can impair the process by adding impurities.

SUMMARY OF THE INVENTION

Building on such elevating tables the present invention is based on the task of creating an elevating table with holding devices which are suitable for securing the workpiece during transport, to carry out position corrections, and which lastly are protected against the effects of the surface treatment.

For this task, the elevating table of the stated type is distinguished according to the invention by including a column which is supported for up and down movement in a housing. A workpiece support is movable upwardly of the column. An annular flange connected to the column extends under the workpiece support and carries rotatably mounted jibs which are pivotally connected to the flange on an axis parallel to the axis of the column, and which in turn carry bearing bodies which can engage the edge of a workpiece carried on the support. The invention also includes a method of transporting a disk-shaped workpiece utilizing this apparatus.

The elevating table has the advantage that the holding elements are disposed within the elevating table in the smallest possible space and are pivotable back and forth between two positions by means of a motor driven shaft, in one position securing the disk-shaped workpiece and after completion of this task, i.e. when the elevating table has lifted the workpiece into the treatment chamber, in another pivot position which is removed from the effects of the surface treatment.

Further details, in particular under the aspect of vacuum technology, for use of the invention in a vacuum surface treatment installation, can be learned from the following specification and the drawings.

DESCRIPTION OF THE PREFERRED EMBODIMENT

Figure 1:
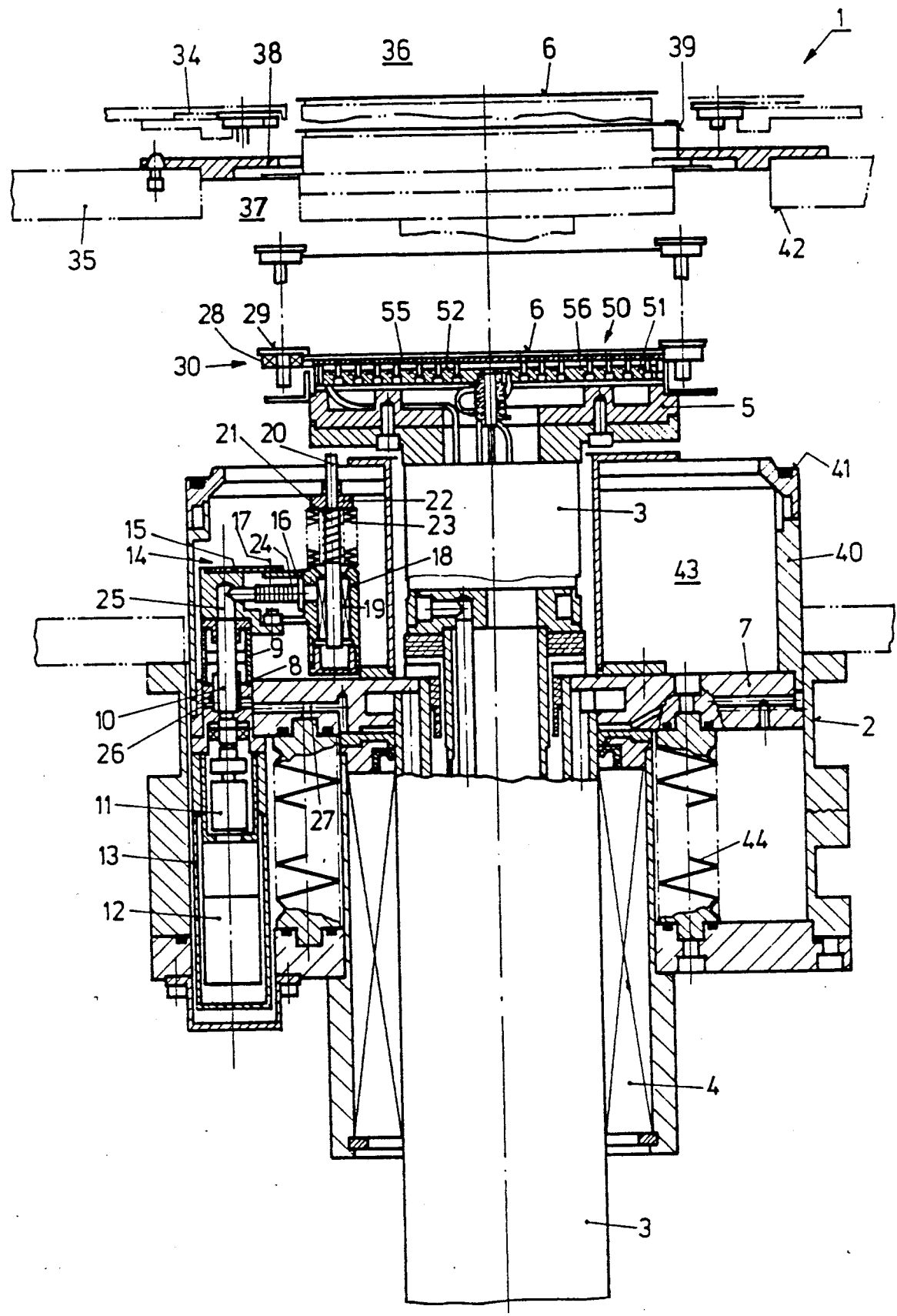
FIG. 1 is a vertical sectional view along line 1—1 of FIG. 2, through the elevating table, whose different positions with respect to the treatment chamber that is loaded by the elevating table, are shown in dot-dash lines.
Figure 2:
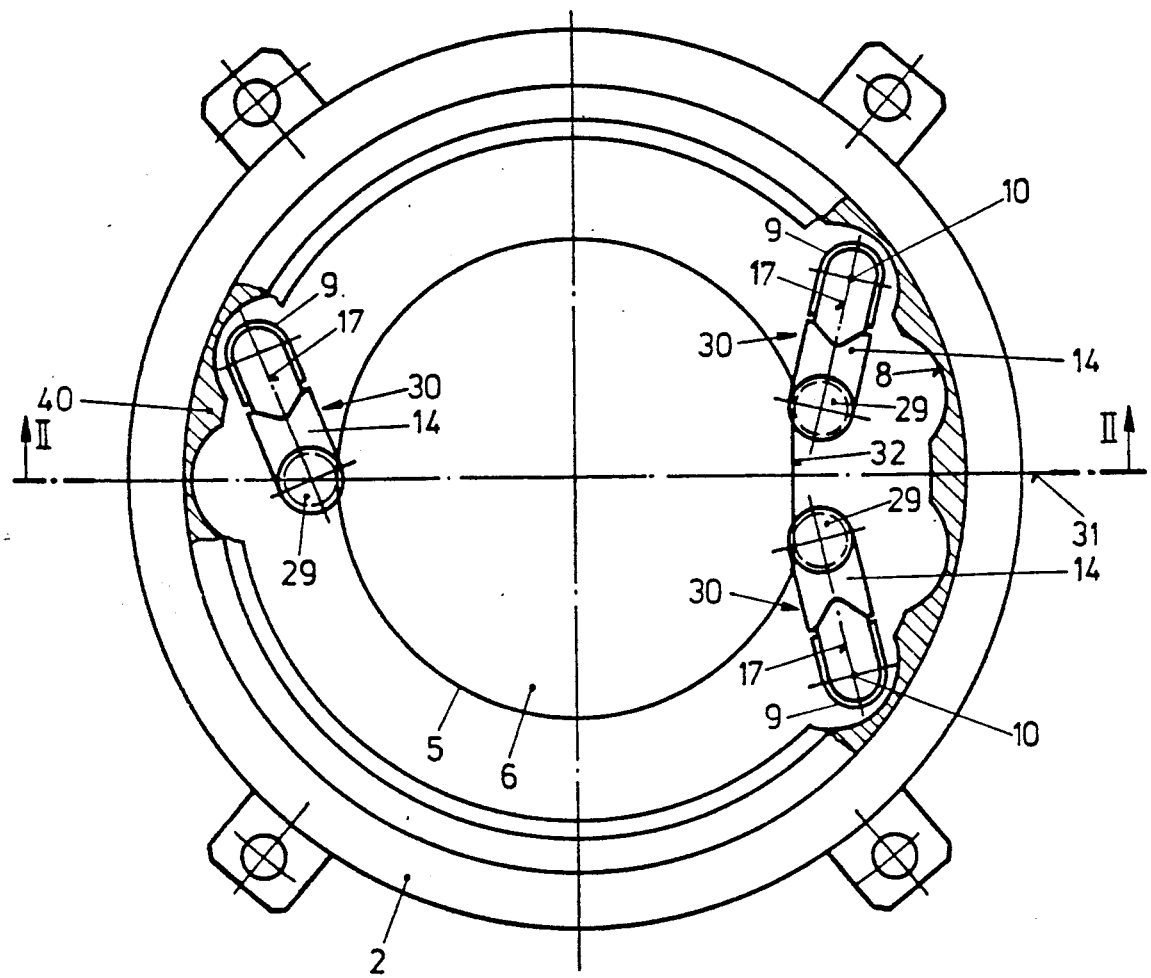
FIG. 2 is a top plan view of the essential parts of the elevating table with the holding elements.

The elevating table shown in FIG. 1 in vertical section, has a ledgeshaped housing 2 in which a column 3 is vertically movably supported by means of a bearing 4. The bearing comprises a ball bearing case which has a device (not shown) operating according to the principle of a cooperating groove and spring to support the column 3 in the housing 2 in a torsion-tight manner. At the upper end, the column 3 has a workpiece support 5 disposed coaxially to the axis of the column on which rests a disk-shaped workpiece 6. At a distance below the workpiece support 5 the column 3 carries an annular flange 7 in which three recesses 8 distributed over the circumference and penetrating the annular flange are positioned. One bearing body 9 is carried in each recess 8 as shown in FIG. 2. A shaft is rotatably supported in each bearing body 9, which is connected at its lower end via coupling elements 11 to a micromotor 12. This micromotor is positioned below the annular flange 7 in a housing 13 fastened at the bottom of the annular flange. At the upper end the shaft 10 carries a two-element jib 14 extending at a right angle to the axis of the shaft and which encompasses two elements 15 and 16 connected to each other through a pivot axis 17 parallel to the shaft so that the external jib 16 is pivotable compared to the jib element 15 fastened to the top of the shaft 10. The jib 14 carries at its other end a bearing body 18 fixed to element 16 in which, by means of a ball bearing case 19, a rod 20 parallel to the axis of the shaft 10, is supported for axial movement. The rod 20 is held axially displacable against the effect of a compression spring 21 engaged around the rod, which spring biases the rod 20 in an upward direction. For this purpose the compression spring 21 is braced with its lower end on the bearing body 18 and with it's upper end at a flange 22 which is on rod 20. One end of a metal bellows 23 is fastened to flange 22. The other end of the bellows is fastened to the bearing body 18. Thereby within the metal bellows 23 and the adjoining bearing body 18 which is closed at the lower end, a closed space is present in which ends a flexible line or conduit 24 extending through the interior of the jib 14 which line is flexible so that the two elements 15 and 16 of the jib 14 can be pivoted with respect to each other. The shaft 10 is hollow and to its hollow space 25 the flexible line 24 is connected. At the motor end of shaft 10 the hollow space 25 is connected via transverse bores 26 to a channel 27 extending in the radial direction through the annular flange 7, which channel in a manner not shown, is connected to a vacuum source so that all these spaces that are connected to each other can be evacuated. Particles potentially originating through abrasion can thus be suctioned off and do not reach the space which is also evacuated and in which the elevating table operates. Likewise, no foreign particles bodies can reach this space either through the bearings 9 and 19.

FIG. 1 is a vertical section through the jib and the connecting parts in the plane of the drawing, however, in reality the jib 14 extends at an angle to the vertical section through the elevating table 1 as can be seen in FIG. 2, so that the above described rod 20 actually ends laterally next to the workpiece support 5 and carries at its end a rotary ring for example in the form of a rolling bearing 28 and above the rolling bearing a disk 29 which extends above the edge of the disk-shaped workpiece 6 resting on the workpiece support 5 in order to hold the workpiece tightly. The rotary ring 28 allows a roll-off motion if the rod 20 is pressed against the workpiece 6 through pivoting by means of its rotary foot in the form of shaft 10 during a pivot motion triggered by the micromotor 12 to correct the position of the workpiece on the workpiece support. The rod as the active element, and all previously described parts for the bearing and pivotal motion of the rod by means of micromotors, is denoted below as a holding element generally designated 30, which still has further functions. As is evident in FIG. 2 a total of three holding elements 30 are present, of which one lies with its rod and its upper disk 29 on the line of symmetry 31 through the workpiece support and two further holding elements 30 lie on opposite sides of the line of symmetry, with the one holding element being diametrically opposed to the two further holding elements. As can be seen in the top view of FIG. 2 the disk support 5 and the disk-shaped workpiece 6 lying thereon have the same outline form, namely circular with a straight edge 32 extending on one side along one chord. Against this edge first the two holding elements 30 which lie at both sides of the line of symmetry 31 are pressed through pivoting of the holding element around the axis of shaft 10 by means of motor 12. This straight edge 32 in the disk-shaped workpiece 6 is also refered to as a flat.

Subsequently the single opposing holding element 30 is pivoted and pressed against the workpiece and if this originally was positioned with the straight edge 32 not exactly parallel to the two holding elements 30 lying next to each other, through the opposing holding element the flat is brought to rest against the two holding elements. If this workpiece is for example a semiconductor wafer, then this process is called correction of the wafer orientation which is important for the following treatment steps. The position of the holding element during engagement is also shown in FIG. 1 in the lower and in the middle position of the elevating table movable in the upward and downward direction while the position brought about through a pivot motion not engaged with the workpiece is shown in FIG. 1 at the very top. The holding element consequently is pivoted only about a small angle and extends in the position in which it is not engaged under a covering 34 against which the rod 20 is pressed during lifting of the workpiece support 5 so that the rod is pressed inward against the action of the spring 21. In this raised position the workpiece support 5 projects into a processing chamber 36 disposed above a vacuum chamber wall 35 wherein the holding elements 30 then are in a position protected under the covering 34 so that the treatment of the workpiece surface taking place in the processing chamber 36, for example a coating with aluminum or an etching process, cannot effect the holding elements lying in a protected position. Thus no coating can grow on the holding elements.

An annular gap 37 is defined between the workpiece support 5 and the opening through the vacuum chamber wall 35. A loose ring 38 substantially covers the annular gap 37. Several hooks 39 are provided on the inner circumference of ring 38. Hooks 39 engage the edge of the workpiece 6 when the workpiece support 5 is located in the raised position. The ring functions simultaneously as a weight load and fixes the workpiece.

The annular flange 7 fixedly arrange on the column 3 is fixedly connected to a cylinder body 40 which is coaxial to the column and whose upper annular surface 41, lying lower compared to the workpiece support 5, is implemented as a valve closing element which comes to rest against an annular surface 42 implemented as a valve seat on the vacuum chamber wall 35, when the elevating table has been raised in the working station so that in this position the workpiece support 5 projects into the working or processing chamber 36, and simultaneously this chamber is sealed against the adjacent space. Between column 3 and the cylinder body 40 fastened on the annular flange 7 is disposed an annular space in which the essential parts of the holding elements 30 are accommodated, of which only the rods 20 extend in the upward direction from the annular space 43.

A metal bellows 44, whose upper end is fastened on the underside of annular flange 7 and whose lower end is fastened at the floor of the housing 2, allows for the up and down motion of the workpiece support 5 in a space which is also evacuated and which is connected to the space below the annular flange 7. The metal bellows 44 thus separates a remaining space below flange 7 from the space around column 3.

So that the workpiece 6 does not shift on the workpiece support 5 during the surface treatment, the workpiece 6 is weighted with the weight of the loose ring 38 which hangs at the edge of the workpiece 6 with the aid of the hooks 39 fastened on the ring.

As further indicated in FIG. 1, the workpiece support 5 may include an electrical heating device 50 with a heating filament 56 disposed in grooves 52 of a plate 51. The grooves 52 are covered by a covering plate 55 carrying the workpiece 6 and can serve for letting in a gas used as a heat transfer medium which can flow out through numerous bores in the covering plate to form a gas cushion at the underside of the workpiece.

While a specific embodiment of the invention has been shown and described in detail to illustrate the application of the principles of the invention, it will be understood that the invention may be embodied otherwise without departing from such principles.

What is claimed is:

1. An elevating table for transporting a disk-shaped workpiece to be moved upwardly and downwardly within a vacuum installation for a surface treatment of the workpiece, the elevating table comprising
   a housing;
   a column mounted for upward and downward movement to the housing, the column having an axis;
   a annular flange fixed to and extending outwardly around the column;
   a plurality of first bearing bodies connected to and spaced around the flange;
   a shaft rotatably mounted to each first bearing body for rotation about an axis extending parallel to the axis of the column;
   a motor connected to each shaft for rotation of each shaft in each first bearing body;
   a two-element jib connected to an upper end of each shaft and extending perpendicularly to the axis of each shaft, each jib having an inner element connected to the shaft and an outer element connected at a pivot axis to the inner element, the pivot axis extending parallel the axis of the shaft;
   a second bearing body connected to the outer element of each jib;
   a rod mounted for axial movement to each second bearing body in a direction parallel to the axis of the shaft;
   a spring engaged with each rod for biasing each rod upwardly with respect to each second bearing body;
   a workpiece support extending upwardly from the column for carrying a disk-shaped workpiece thereon, the workpiece support being positioned above the flange and the flange extending outwardly of the workpiece support with respect to the column; and
   a holding element at an upper end of each rod for extending upwardly and laterally of the workpiece support for engagement against an edge of a workpiece held on the workpiece support.

2. An elevating table according to claim 1, wherein each of the holding elements comprises a rotary ring for pressing against the edge of a workpiece held on the workpiece support.

3. An elevating table according to claim 2, wherein each holding element includes a disk element for engagement over a workpiece on the workpiece support.

4. An elevating table according to claim 3, including three first bearing bodies mounted to the annular flange at locations so that one of the holding elements is positioned on a line of symmetry through the workpiece support and two of the holding elements are positioned on opposite sides of the line of symmetry at a diametrically opposed position from the one holding element.

5. An elevating table according to claim 4, wherein the annular flange has an outer edge, a cylinder body fixedly connected to the outer edge of the annular flange and coaxial around the column, the cylinder body having an upper surface defining a valve closing element for engaging and forming a seal with a valve seat formed on a vacuum chamber wall of the vacuum installation when the elevating table is raised, a protective housing engaged around each motor and connected to a lower surface of the annular flange, the motor of each shaft being disposed below the annular flange.

6. An elevating table according to claim 5, including a metal bellows for each second bearing body, the metal bellows having one end connected to the second bearing body and an opposite end connected to the rod of the second bearing body for at least partly covering the rod.

7. An elevating table according to claim 6, wherein the spring is engaged between the rod and the second bearing body and disposed within the metal bellows.

8. An elevating table according to claim 7, wherein each second bearing body forms a casing for containing at least part of each respective rod.

9. An elevating table according to claim 7, including a ball bearing mounted in each second bearing body for guiding the axial movement of each respective rod.

10. An elevating table according to claim 7, wherein each second bearing body defines a closed interior space, each jib including a flexible line extending therein and communicating with the interior space for use in evacuating the interior space.

11. An elevating table according to claim 10, wherein the shaft comprises a hollow shaft, the flexible line connecting the interior space to an interior of the hollow shaft, and a transverse bore in the annular flange connected to the interior space of each hollow shaft.

12. An elevating table according to claim 11, including a metal bellows connected between the annular flange and the housing for engagement around at least part of the column.

13. An elevating table according to claim 12, including a cover positioned around the workpiece support when the workpiece support is in a raised position, the cover being located so that with the workpiece support raised, each holding element is engaged tightly below and protected by the cover with the spring biasing the rod for tightly engaging the holding element against the cover.

14. An elevating table according to claim 13, including a free annular ring positioned below the cover and including a plurality of hooks positioned at a location so that with the workpiece support raised, the hooks engage against a workpiece on a workpiece support for applying a load on a workpiece on the workpiece support.

15. An elevating table according to claim 1, wherein each holding element includes a disk element for engagement over a workpiece on the workpiece support.

16. An elevating table according to claim 1, including three first bearing bodies mounted to the annular flange at locations so that one of the holding elements is positioned on a line of symmetry through the workpiece support and two of the holding elements are positioned on opposite sides of the line of symmetry at a diametrically opposed position from the one holding element.

17. An elevating table according to claim 1, wherein the annular flange has an outer edge, a cylinder body fixedly connected to the outer edge of the annular flange and coaxial around the column, the cylinder body having an upper surface defining a valve closing element for engaging and forming a seal with a valve seat formed on a vacuum chamber wall of the vacuum installation when the elevating table is raised, a protective housing engaged around each motor and connected to a lower surface of the annular flange, the motor of each shaft being disposed below the annular flange.

18. An elevating table according to claim 1, including a metal bellows for each second bearing body, the metal bellows having one end connected to the second bearing body and an opposite end connected to the rod of the second bearing body for at least partly covering the rod.

19. An elevating table according to claim 18, wherein the spring is engaged between the rod and the second bearing body and disposed within the metal bellows.

20. An elevating table according to claim 18, wherein each second bearing body forms a casing for containing at least part of each respective rod.

21. An elevating table according to claim 18, including a ball bearing mounted in each second bearing body for guiding the axial movement of each respective rod.

22. An elevating table according to claim 18, wherein each second bearing body defines a closed interior space, each jib including a flexible line extending therein and communicating with the interior space for use in evacuating the interior space.

23. An elevating table according to claim 22, wherein the shaft comprises a hollow shaft, the flexible line connecting the interior space to an interior of the hollow shaft, and a transverse bore in the annular flange connected to the interior space of each hollow shaft.

24. An elevating table according to claim 1, including a metal bellows connected between the annular flange and the housing for engagement around at least part of the column.

25. An elevating table according to claim 1, including a cover positioned around the workpiece support when the workpiece support is in a raised position, the cover being located so that with the workpiece support raised, each holding element is engaged tightly below and protected by the cover with the spring biasing the rod for tightly engaging the holding element against the cover.

26. An elevating table according to claim 25, including a free annular ring positioned below the cover and including a plurality of hooks positioned at a location so that with the workpiece support raised, the hooks engage against a workpiece on the workpiece support for applying a load on a workpiece on a workpiece support.

* * * * *